United States Patent [19]
Kinzer

[11] Patent Number: 5,786,619
[45] Date of Patent: Jul. 28, 1998

[54] DEPLETION MODE POWER MOSFET WITH REFRACTORY GATE AND METHOD OF MAKING SAME

[75] Inventor: Daniel M. Kinzer, Riverside, Calif.

[73] Assignee: International Rectifier Corporation, El Segundo, Calif.

[21] Appl. No.: 564,917

[22] Filed: Nov. 30, 1995

Related U.S. Application Data

[62] Division of Ser. No. 160,172, Feb. 25, 1988, Pat. No. 5,472,888.

[51] Int. Cl.$^6$ .......................... H01L 29/76; H01L 29/94; H01L 27/01; H01L 27/12
[52] U.S. Cl. .......................... 257/403; 257/335; 257/337; 257/402
[58] Field of Search .......................... 257/335, 337, 257/402, 403

[56] References Cited

U.S. PATENT DOCUMENTS

| | | |
|---|---|---|
| 4,455,565 | 6/1984 | Goodman et al. . |
| 4,532,534 | 7/1985 | Ford et al. . |
| 4,558,243 | 12/1985 | Schutten et al. .......................... 307/584 |
| 4,571,606 | 2/1986 | Benjamin et al. . |
| 4,743,952 | 5/1988 | Baliga . |
| 4,902,636 | 2/1990 | Akiyama et al. . |
| 4,974,059 | 11/1990 | Kinzer . |
| 5,055,895 | 10/1991 | Akiyama et al. . |
| 5,475,252 | 12/1995 | Merril et al. .......................... 257/341 |

FOREIGN PATENT DOCUMENTS 61-285770  12/1986  Japan .

OTHER PUBLICATIONS

"Silicon Processing for the VLSI Era; vol. 1: Process Technology"; S. Wolf and R. Tauber; 1986; pp. 220–223 and 384–405; Lattice Press.

"VLSI Technology"; S.M. Sze; 1983; pp. 357–361; McGraw-Hill Series in Electrical Engineering.

"Low-Temperature Silicon Process Techniques for VLSIC Fabrication"; Stephen C. Su; Solid State Technology; Mar. 1981; pp. 72–74.

*Primary Examiner*—Ngân V. Ngô
*Attorney, Agent, or Firm*—Ostrolenk, Faber, Gerb & Soffen, LLP

[57] ABSTRACT

A depletion mode power MOSFET has a gate electrode formed of material that is refractory, or resistant, to high temperature encountered during device fabrication. A depletion channel region which is formed in a base region of a MOSFET and which interconnects the source and drain regions is formed after a high temperature drive to form the base region, but before a gate oxide and gate and source electrodes are formed at lower temperatures. The depletion channel region is thus subjected to reduced temperatures and grows only slightly in thickness, so that it can be easily depleted. The gate oxide, similarly, is subjected to reduced temperatures, and, particularly when made thin, exhibits high insensitivity to radiation exposure.

7 Claims, 3 Drawing Sheets

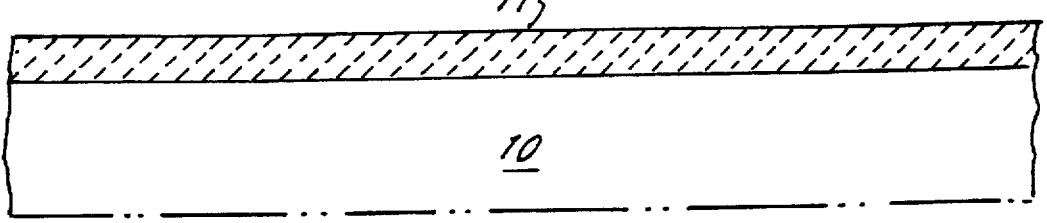
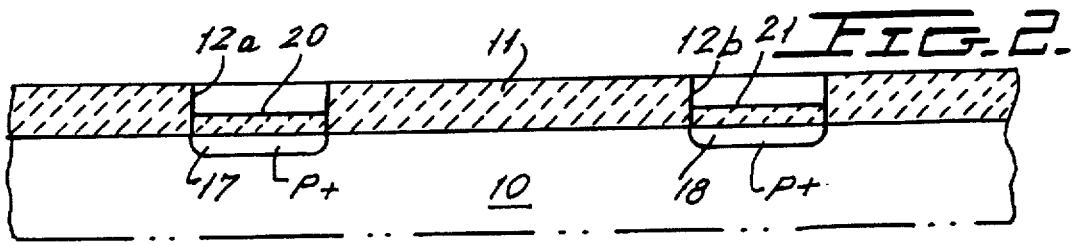
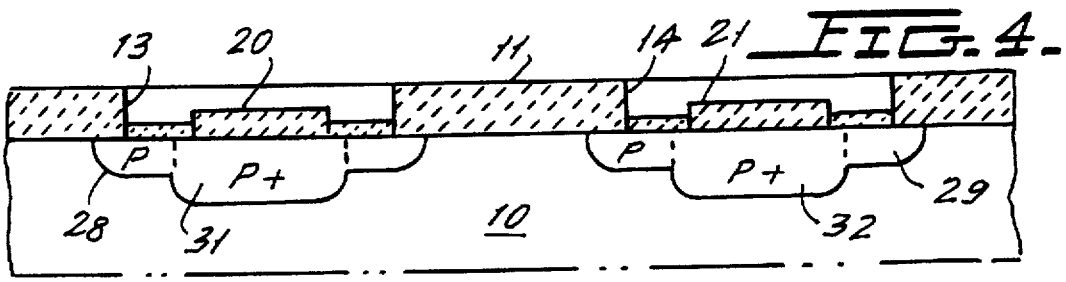
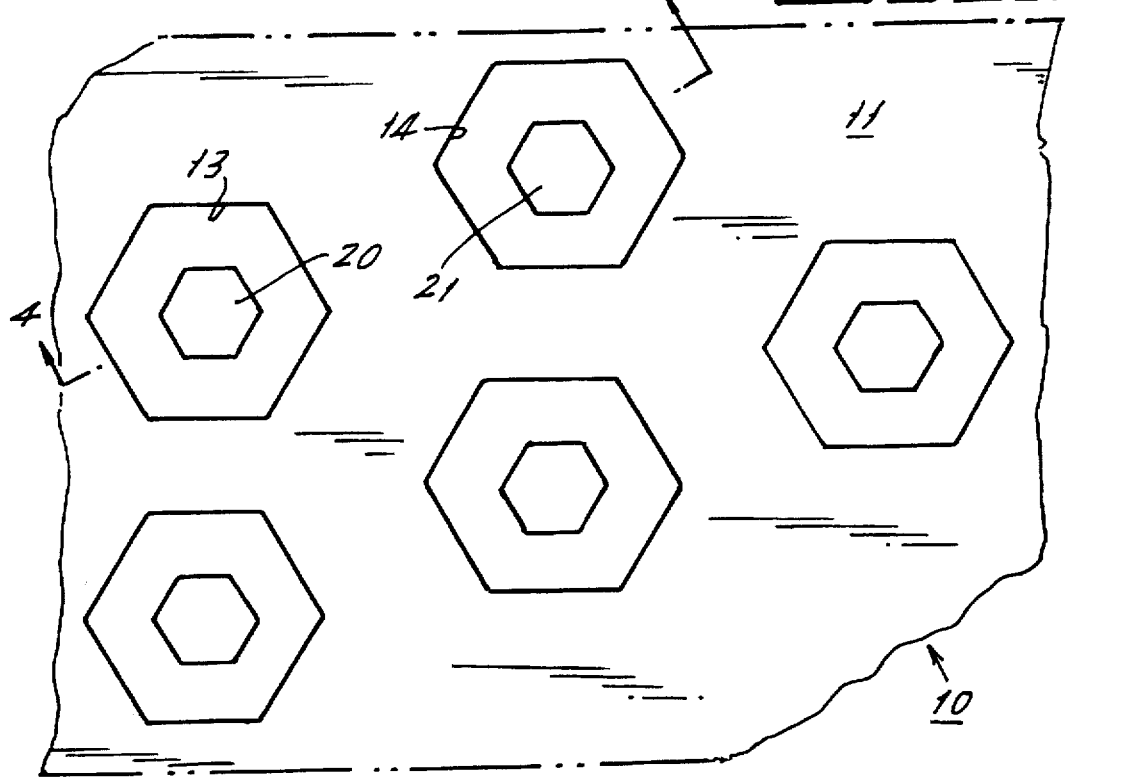

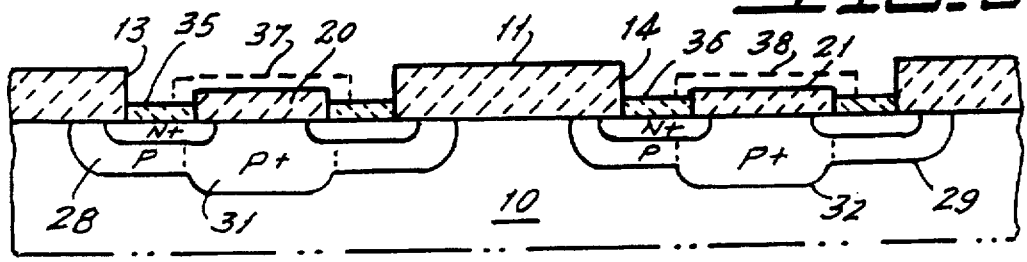
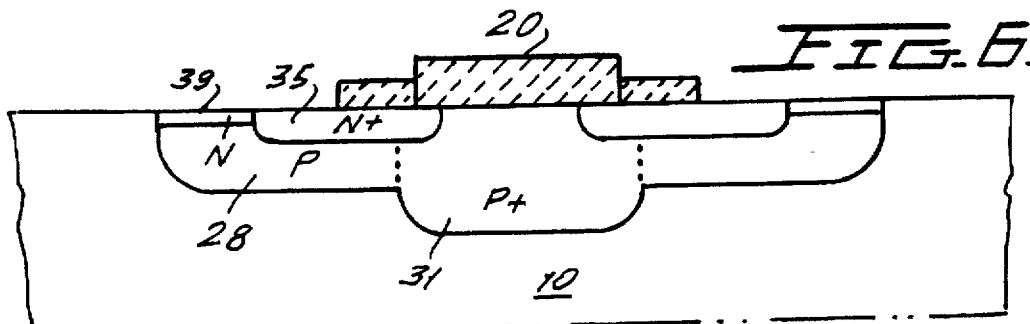
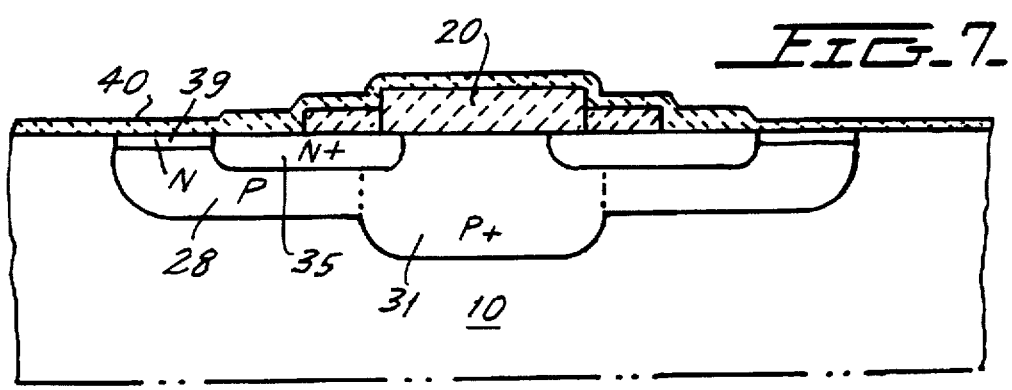
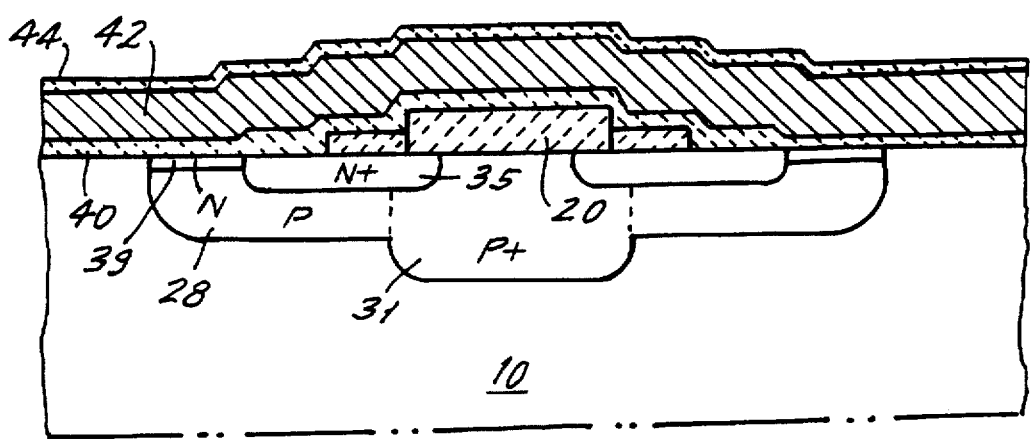

DEPLETION MODE POWER MOSFET WITH REFRACTORY GATE AND METHOD OF MAKING SAME

CROSS REFERENCE TO RELATED APPLICATION

This is a division of application Ser. No. 07/160,172, filed Feb. 25, 1988, now U.S. Pat. No. 5,472,888.

This application is related to copending application Ser. No. 1,629, entitled PROCESS FOR MANUFACTURE OF RADIATION RESISTANT POWER MOSFET AND RADIATION RESISTANT POWER MOSFET by Daniel M. Kinzer et al. and assigned to the present assignee.

BACKGROUND OF THE INVENTION

This invention relates to a method of manufacture of a depletion mode power MOSFET having a gate electrode formed of material that is refractory, or resistant, to high temperature encountered during thermal growth of oxide or any other high temperature encountered during device fabrication.

Material that is refractory, or resistant, to any high temperature encountered during device fabrication includes, for example, polysilicon; tungsten or other refractory metals; or titanium silicide or other refractory silicides formed from the known "polycide" process. For convenience, all such materials are referred to simply as "refractory".

Power metal oxide semiconductor field-effect transistors ("MOSFETs") are well known devices, and are typically used for power switching applications. As is known, a MOSFET includes source and drain regions of a first conductivity type, and a base region of a second conductivity type, which separates the source and drain regions. A conduction channel is formed in the base region to interconnect the source and drain regions and enable device conduction.

A depletion mode MOSFET uses a thin "depletion" channel region of the first conductivity type at the surface of the base region, which interconnects the source and drain regions. An electric field induced by a gate electrode above the depletion channel region empties such region of mobile carriers and thereby stops current conduction in the device. An enhancement mode MOSFET, on the other hand, does not utilize a channel layer of a first conductivity type beneath the gate electrode. Such device, instead, relies on an appropriate bias on a gate situated above the surface of the base region to induce an inversion channel in the base region, which conductively interconnects the source and drain regions.

The standard process for producing power MOSFETs is not applicable to depletion mode MOSFETs. In the standard manufacturing process, a highly-doped material, such as polysilicon, is patterned on the device to form a gate electrode. The gate electrode is then used as a mask to form a base region that is diffused at high temperature, such as 1175° C., for an extended period of time, such as 120 minutes. If the gate electrode is used as the base region mask, the depletion channel region must be formed prior to forming the gate electrode. The high temperature thermal drive used to form the base region, however, causes the thin depletion region to grow in thickness and to be harder or impossible to deplete with typical gate voltages.

One approach to prevent the depletion region from growing in thickness is to use a metal gate electrode rather than a refractory gate electrode. This is because metal can be formed at a temperature that is relatively low and at which the depletion channel region does not grow in thickness. The resulting device, however, is complicated because two metal systems must be accommodated on the device upper surface: one for the gate electrode, and the other for the source electrode.

It would, therefore, be desirable to provide a method of manufacturing a depletion mode power MOSFET having a gate electrode formed of refractory material.

An additional drawback of conventionally-made MOSFETs is that their gate oxides are highly sensitive to ionizing radiation. Such radiation is known to induce charges in the gate oxide, which produces a shift in the gate-to-source threshold voltage. The gate-to-source threshold voltage decreases with increasing total radiation dose for N channel devices and increases with total dose for P channel devices. The gate drive circuitry must be designed to offset these threshold voltage shifts by overriding them with appropriate biasing levels. This complicates the control circuitry. A description of the shift in threshold voltage is described in more detail in a paper entitled "Radiation Resistance of Hexfets", contained at pages B-10 through B-12 of the Hexfet Databook of 1985, published by the International Rectifier Corporation, El Segundo, Calif.

It would thus be desirable to provide a power MOSFET having a gate-to-source threshold voltage that is close to constant regardless of exposure to radiation dosages up to 1 megarad, for example.

SUMMARY OF THE INVENTION

An object of the invention is to provide a depletion mode power MOSFET incorporating a refractory gate electrode, and to provide a method of making the same.

A further object of the invention is to provide a power MOSFET with a gate-to-source voltage that is nearly constant regardless of exposure to radiation up to 1 megarad, for example.

In accordance with a preferred process of manufacturing a depletion mode power MOSFET having a refractory gate electrode, a plurality of spaced base regions of one conductivity type are formed in a layer of semiconductor material of the opposite conductivity type. The base regions are formed by introducing into the layer dopant of the one conductivity type at selected locations on the surface of the layer. Such dopant is then thermally driven to a first depth beneath the surface by maintaining the semiconductor layer at a relatively high temperature for a given period of time. Thereafter, a plurality of source regions of the opposite conductivity type are respectively formed in the base regions. The source regions are formed by introducing and thermally driving dopant of the one conductivity type at selected locations on the surface of the layer. The source regions are driven to a second depth less than the first depth. An outer periphery of each of the source regions is spaced from the periphery of its associated base region.

Respective depletion channel regions are then formed in each of the base regions by introducing dopant of the one conductivity type into the upper portion of the base regions. This may be done by a blanket deposition of arsenic, for example. Thereafter, a gate oxide is formed over the depletion channel regions and is made as thin as practical. A refractory electrode layer is formed over the gate oxide and patterned to serve as the gate electrode. A dielectric layer is formed over the gate electrode, and a source electrode is formed over part of the source region. All process steps for forming the gate oxide and gate electrode, the dielectric layer on the gate electrode, and the source electrode employ temperatures considerably lower than the high temperature used to form the base regions. As a result, the depletion channel regions are subjected to relatively low process temperatures, and thus grow very little in thickness. The gate oxide also exhibits a high degree of insensitivity to radiation exposure, thereby maintaining nearly constant the gate-to-source threshold voltage of the device.

The invention also relates to a depletion mode power MOSFET having a refractory gate electrode. Such MOSFET includes a plurality of spaced base regions of one conductivity type in a layer of semiconductor material of the opposite conductivity type. Included in the base regions are a plurality of respective source regions of the opposite conductivity type. An outer periphery of each of the source regions at a first surface of the semiconductor layer is spaced from the periphery of its associated base region at such surface. A plurality of depletion channel regions of the opposite conductivity type are respectively formed at the upper surfaces of the base regions. A gate oxide overlies the depletion channel regions and, in turn, is overlain by a refractory gate electrode. A dielectric layer overlies the gate electrode, and a source electrode is provided in contact with the source regions.

The depletion mode MOSFET of the invention thus includes a refractory gate electrode, and can be made smaller than MOSFETs with a metal gate electrode.

BRIEF DESCRIPTION OF THE DRAWINGS

The above objects as well as other objects of this invention shall become readily apparent after reading the following description of the accompanying drawings in which:

FIG. 1 is a cross-section of a chip of silicon which is to be processed in accordance with the invention and after the growth of a field oxide.

FIG. 2 shows the chip of FIG. 1 after the first mask operation and the ion implantation of a dose of boron atoms.

FIG. 3 is a plan view of a chip of FIGS. 1 and 2 after a second mask operation in which an array of hexagonal openings are etched through the field oxide.

FIG. 4 is a cross-sectional view of FIG. 3 taken across section lines 4—4 in FIG. 3 in which boron atoms are implanted and driven through the open window, followed by an anneal step to form base regions each having a central, deeper region of relatively high conductivity.

FIG. 5 shows the chip of FIG. 4 in which phosphorous atoms were implanted and driven through the open window, followed by an anneal step, to form N-type source regions, and further shows a photoresist pattern subsequently applied over the central oxide button of each cell by a third mask step.

FIG. 6 shows the chip of FIG. 5 after an oxide etching step and after a blanket implantation of arsenic to form depletion channel regions in the base regions.

FIG. 7 shows the chip of FIG. 6 after the formation of a thin gate oxide layer.

FIG. 8 shows the chip of FIG. 7 after the deposition of a polysilicon layer and a thin oxide coating thereon.

DESCRIPTION OF THE PREFERRED EMBODIMENTS

Figure 9:
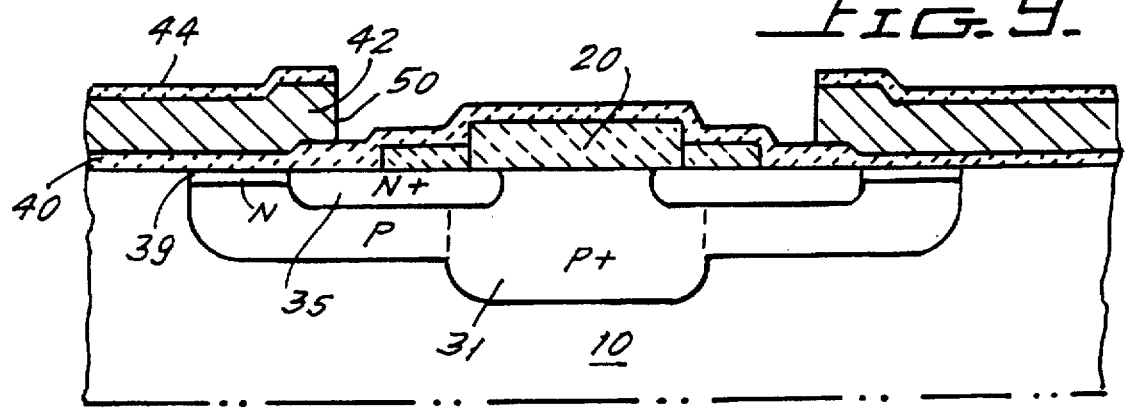
FIG. 9 shows the fourth mask step for patterning the polysilicon.

The figures show the manner in which an N-channel depletion mode device can be manufactured in accordance with the invention. It will be obvious to those skilled in the art, however, that P-channel devices can similarly be formed, making appropriate modifications in the conductivity types which are defined by the process.

Referring first to FIG. 1, there is shown an upper portion of a wafer of monocrystalline silicon having an epitaxially deposited layer 10 thereon. In the usual fashion for forming a multicellular device, a large number of identical cells will be fabricated in a common wafer which is later diced to produce individual devices that are appropriately packaged. The epitaxial layer 10 may have a resistivity of 6.8–7.8 ohm-cm for the manufacture of a power MOSFET device having a reverse breakdown voltage of 250–300 volts.

Before processing has begun, a sacrificial oxide layer (not shown) having a thickness of about 7,000 angstroms may be first grown on the surface of layer 10 and thereafter etched away, thus assuring a clean surface. Thereafter, the first step for the process shown in FIG. 1 is carried out, which is the formation of a field oxide 11 having a thickness of 14,000 angstroms, for example. Any standard oxide growing process can be used.

Thereafter, a first mask is applied to the surface of oxide 11 and an oxide etch is carried out to cut annular openings, shown as openings 12a and 12b in FIG. 2, in oxide layer 11. Openings 12a and 12b are for a pair of respective cells. The cells are spaced on centers which may be separated by 38 microns, for example. These openings are arranged in a regular pattern over the full surface of the active portion of the device and define the centers of each of the individual MOSFET cells which are to be formed in the device. Typically, 22,000 openings, such as openings 12a and 12b can be formed in a typical device (or die). A 5-inch wafer is later diced into 240 individual die.

After openings 12a and 12b have been formed, a boron ion implant step is carried out in which boron ions having an energy of 120 kv are implanted through the openings at a flux of about $7 \times 10^{14}$ ions per cm$^2$. After the implant step, the boron ions are driven at a temperature of 1050° C. for 100 minutes, thereby forming the shallow P+ regions 17 and 18 shown in FIG. 2. At the same time, regrown oxide layers shown as layers 20 and 21 are formed over the bottom surfaces of the openings formed by windows 12a and 12b. Oxide layers or dots 20 and 21 are grown to a thickness of about 5000 angstroms.

Thereafter, a second masking step is carried out to form the geometry shown in FIGS. 3 and 4. More specifically, in the second masking step, hexagonal openings having a perpendicular distance between parallel flats of about 23 microns are etched in regions coaxial with the centers of openings 13 and 14. Two such openings 13 and 14, associated with dots 20 and 21, are shown in FIGS. 3 and 4. The geometric pattern of the surface of the entire wafer is partially shown in FIG. 3. During the etching operation of FIGS. 3 and 4, the diameter of oxide dots 20 and 21 is reduced to about 11 microns. This step is not self-aligned. The step of FIGS. 3 and 4 is used to define the base and source diffusions as will now be described.

The base region is first formed, as shown in FIG. 4, by a boron implant step. Thus, boron ions are implanted through the respective annular windows formed between the peripheries of windows 13 and 14 and the central dots 20 and 21, respectively. The boron implant is carried out at a typical energy of 80 kv and a flux of 1–10×10$^{13}$ ions/cm$^2$ for about 0.1 minute. These ions are then driven at a temperature of 1175° C. for about 120 minutes, thereby to define each base region 28 and 29 shown in FIG. 4 and, at the same time, to deepen P+ regions 17 and 18 so as to form deeper regions 31 and 32, respectively.

After the boron implant and drive, the source regions are formed by implanting phosphorous atoms through the windows in FIG. 4 at an energy of 50 kv and flux of 1–50×10$^{14}$ ion/cm$^2$. The phosphorous atoms define the N type source regions 35 and 36 shown in FIG. 5, which are annular regions surrounding P+ regions 31 and 32, respectively.

Following this operation, an annealing step is carried out wherein the wafer is heated at about 975° C. for 20 minutes in nitrogen gas, and thereafter for 100 minutes in dry oxygen while the temperature is ramped down. At this point in device manufacture, the gate oxide still has not been applied to the device and has avoided all thermal cycling thus far.

The wafer of FIG. 5 is then subjected to a third masking step in which the mask is provided with openings to enable the formation of a photoresist coating over the various dots 20 and 21. The photoresist coating is shown in dashed lines in FIG. 5 as the photoresist coatings 37 and 38. All exposed oxide is then removed by an appropriate oxide etch as shown in the enlarged view of FIG. 6, showing the left-hand cell of FIG. 5.

As further shown in FIG. 6, a blanket implant of arsenic is carried out to form thin N-conductivity type depletion channel regions at the upper portion of base regions 28 and 29. Such a thin depletion channel region is shown as region 39 in FIG. 6, which is annular and surrounds the periphery of N+ source region 35. The arsenic implant energy level and dosage is chosen to produce a low doping concentration in region 39, preferably below about 5×10$^{11}$ atoms/cm$^3$, and a depth of less than about 5000 angstroms, preferably below about 1000 angstroms.

Depletion channel region 39 should be kept thin to assure that it can be easily depleted by readily-available gate voltages. In accordance with the invention, the subsequent processing steps are carried out at temperatures well below the 1175° drive temperature used to form P base regions 28 and 29. Region 39, thus, does not grow much in thickness as it would if formed prior to the high temperature base device. Preferably also, depletion channel layer 39 is doped with arsenic, which has a relatively low diffusivity.

The wafers are then processed for the development of the gate oxide coating. The gate oxide coating is shown in FIG. 7 as oxide coating 40, which preferably has a thickness of about 700 to 900 angstroms, and is formed as described below. The oxide grows relatively more quickly where it overlies highly-doped N+ source region 35, because silicon oxide typically grows relatively faster over the highly-doped silicon. The thinnest oxide layer practical is grown, to reduce the threshold gate bias level to deplete N depletion channel layer 39, and also to reduce the threshold gate bias shift in the presence of a radiation dose. By growing the gate oxide at the step of FIG. 7 in the manufacturing process, there is a substantial reduction of post-oxidation thermal cycling at high temperature, which would make the device more sensitive to radiation.

Following the formation of gate oxide coating 40, and as shown in FIG. 8, a polysilicon or other refractory layer 42 is formed over the device surface. Next, POCl is deposited onto the polysilicon layer. That deposition takes place at about 925° C. to heavily dope the polysilicon gate electrode layer. The polysilicon layer 42 is then covered by a very shallow oxide layer 44 which can have a thickness, for example, of about 500 angstroms and is used so that it can serve as a mask to pattern the polysilicon 42 in a later step.

A fourth masking step employs a mask to pattern the polysilicon to open hexagonal openings such as opening 50 in FIG. 9 at each of the cell sites. An etchant preferential to silicon is used to leave oxide dots 20 and coating 40 intact. Opening 50 has a diameter from flat to flat (i.e. perpendicularly to the parallel flats of the hexagonal cell) of about 21 microns. The interior edges of the windows 50 slightly overlap the thickened oxide coating 40 over source region 35. Consequently, polysilicon layer 42 is further removed from the surface of silicon 10 to reduce input capacitance.

Oxide coating 40 can be further thickened at this point to reduce input capacitance. Such thickening of coating 40 is typically carried out at 900° C. in a pyrogenic steam ambient for 15 to 45 minutes. This also oxidizes the polysilicon side walls forming a conforming oxide. This improves gate reliability.

Figure 10:
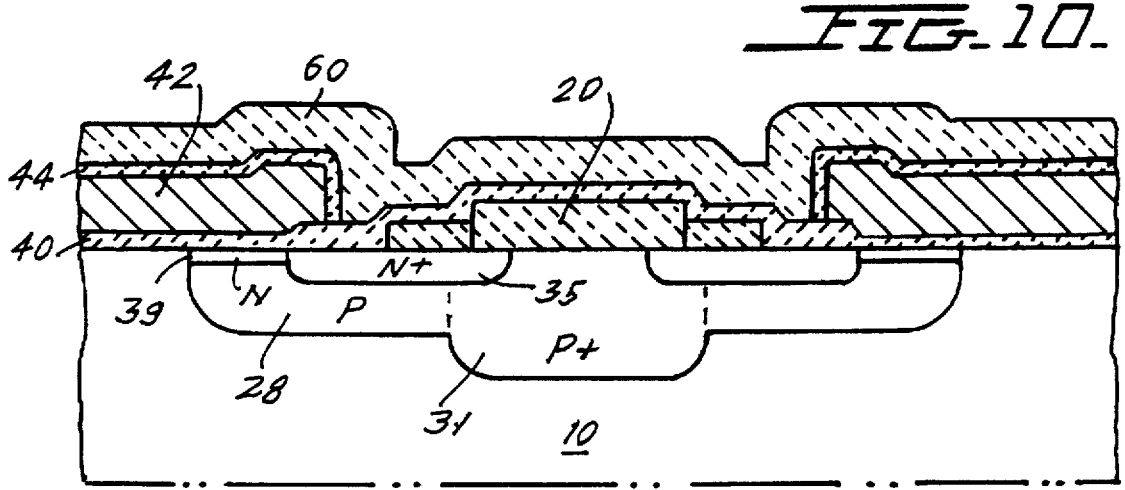
FIG. 10 shows the chip of FIG. 9 after the deposition of an LTO layer and reflow thereof.

Thereafter, LTO (phosphorous doped silicon dioxide) is formed over the device surfaces shown in FIG. 10. The LTO layer 60 is then subjected to about 900° C. in a wet atmosphere for about 1 hour to obtain the desired reflow of the LTO material. This again does not adversely affect the depletion channel region 39 nor gate oxide 40. Note that the oxide layer 40 is thick enough to keep the phosphorous in the LTO layer from diffusing through. A thickness of about 1500 angstroms for region 40 is sufficient for this purpose.

Figure 11:
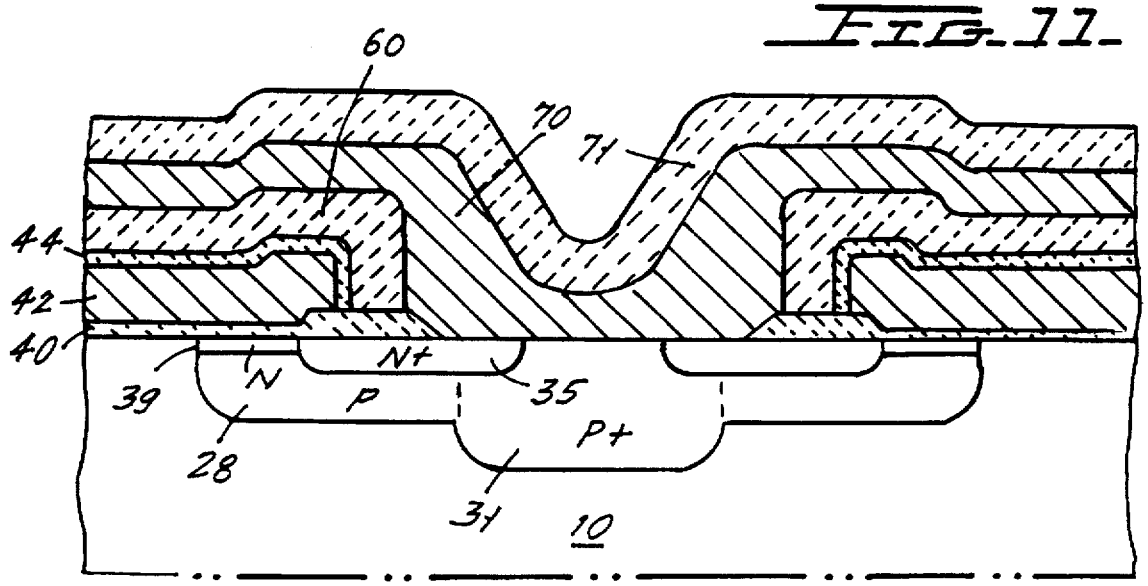
FIG. 11 shows the chip of FIG. 10 after the fifth mask step in which windows are pierced in the LTO layer, aluminum contact metal is deposited over the device surface, and a surface passivation layer is formed on such contact metal.

Thereafter, and as shown in FIG. 11, a sixth masking operation takes place in which mask openings, each about 10 microns in diameter, are located over the center of the P+ regions such as region 31 to form openings for exposing the silicon for a contact deposition operation. An aluminum layer 70 is then deposited over the surface and makes contact with the P+ dots 31, 32 (FIG. 5) and the source region 35.

Thereafter, conventional steps are carried out to complete the chip structure, including an etching operation which patterns the aluminum coating 70 to define and separate the source electrode from gate bus fingers as disclosed, for example, in U.S. Pat. No. 4,593,302. A scratch coating, which is a surface passivation consisting of phosphorous doped glass having a lower phosphorous concentration that LTO is then formed as the layer 71 in FIG. 11.

In applying the gate oxide, the gate oxide can preferably be grown in one of several ways. It can be grown at 900° C. in wet steam without an anneal, or can be grown at 900° C. or 1000° C. in dry oxygen with no anneal. Both of these methods are known to produce enhanced radiation hardness. Other techniques which can be used are growing the oxide layer 40 at 900° C. in wet steam followed by an anneal at 900° C. in nitrogen. Alternatively, the oxide layer can be grown at 900° C. in wet steam with a dry oxygen gas anneal at 900° C. Both of these processes can enhance radiation hardness. Also, the oxide layer can be grown at 975° C. or 1000° C. in dry oxygen and annealed in nitrogen or forming gas. These processes can also enhance radiation hardness.

In the manufacture of the devices described above with refractory gate electrodes, it will be apparent that the very thin gate depletion channel region 39 is not subjected to substantial thermal cycling, thereby assuring that it can be depleted with readily available biasing voltages on the gate. The use of arsenic for forming the depletion channel region is extremely useful, since arsenic has a relatively low diffusivity. The use of a refractory material for the gate electrode minimizes the space required for the upper electrode system of the device, since the metal source electrode can overlie the refractory gate electrode. Additionally, by forming the gate oxide late in the process of manufacture, with minimal thermal cycling, the gate becomes relatively insensitive to radiation damage. The device, in fact, exhibits a relatively flat curve of threshold gate-to-source voltage as a function of total radiation dose up to and exceeding 1 megarad.

Although the present invention has been described in connection with a plurality of preferred embodiments thereof, many other variations and modifications will now become apparent to those skilled in the art. A non-cellular vertical conduction device can be formed rather than the multicellular device described above, for example. Also, the invention is not limited to vertical conduction devices, and applies to lateral conduction devices. It is preferred, therefore, that the present invention be limited not by the specific disclosure herein, but only by the appended claims.

What is claimed is:

1. A depletion mode power MOSFET with a refractory gate, comprising:

a base region of one conductivity type formed in a layer of semiconductor material of the opposite conductivity type by process steps including introducing dopant of the one conductivity type into an upper surface of said layer at a selected location and thermally driving said dopant to a first depth beneath the surface by maintaining said layer at a high temperature;

a source region of the opposite conductivity type formed in said base region, with an outer periphery of said source region at a surface of said layer being spaced from a periphery of said base region at said surface;

a depletion channel region of the opposite conductivity type formed at the upper surface of said base region after formation of said base region and interconnecting said peripheries of said source and base regions;

a gate oxide over said depletion channel region;

a refractory gate electrode over said gate oxide;

a dielectric layer over said gate electrode; and a source electrode contacting said source region;

said gate oxide, said refractory gate electrode, said dielectric layer and said source electrode being formed by process steps employing temperatures lower than said high temperature used to form said base region so that the depth of said depletion channel region is minimized, wherein said depletion channel region is less than about 5,000 angstroms deep.

2. The power MOSFET of claim 1, wherein said depletion channel region contains dopant having a diffusivity less than a dopant contained in the source region.

3. The power MOSFET of claim 2, wherein said dopant of said depletion channel region is arsenic.

4. The power MOSFET of claim 1, wherein said base, source and depletion channel regions define a cell, and further comprising a plurality of further cells of same construction as said first-mentioned cell, thereby defining a multicellular device.

5. The power MOSFET of claim 1, wherein said refractory gate electrode comprises polysilicon.

6. The power MOSFET of claim 1, wherein said refractory gate electrode comprises a refractory metal.

7. The power MOSFET of claim 1, wherein said refractory gate electrode comprises a refractory silicide.

* * * * *